US012738730B2

(12) United States Patent
Walker et al.

(10) Patent No.: US 12,738,730 B2
(45) Date of Patent: *Sep. 15, 2026

(54) METHOD AND SYSTEM FOR A FIN-BASED VOLTAGE CLAMP

(71) Applicant: SEMICONDUCTOR COMPONENTS INDUSTRIES, LLC, Scottsdale, AZ (US)

(72) Inventors: Andrew J. Walker, Mountain View, CA (US); Clifford Ian Drowley, Los Altos, CA (US); Subhash Srinivas Pidaparthi, San Jose, CA (US); Andrew P. Edwards, San Jose, CA (US); Shahin Sharifzadeh, Menlo Park, CA (US); Joseph Tandingan, Cupertino, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 132 days.

This patent is subject to a terminal disclaimer.

(21) Appl. No.: 18/932,513

(22) Filed: Oct. 30, 2024

(65) Prior Publication Data

US 2025/0055276 A1 Feb. 13, 2025

Related U.S. Application Data

(63) Continuation of application No. 18/137,314, filed on Apr. 20, 2023, now Pat. No. 12,155,204.

(60) Provisional application No. 63/335,299, filed on Apr. 27, 2022.

(51) Int. Cl.
*H02H 9/04* (2006.01)
*H10D 89/60* (2025.01)

(52) U.S. Cl.
CPC .......... *H02H 9/045* (2013.01); *H10D 89/814* (2025.01)

(58) Field of Classification Search
CPC .............................. H02H 9/045; H10D 89/814
USPC ............................................................ 361/56
See application file for complete search history.

(56) References Cited

U.S. PATENT DOCUMENTS

2007/0025034 A1* 2/2007 Chaudhary ........ H03K 17/6871 257/E27.112
2023/0260996 A1* 8/2023 Drowley ............ H10D 62/8503 257/288

FOREIGN PATENT DOCUMENTS

DE 102019118515 A1 * 4/2020 ........ H01J 37/32724

OTHER PUBLICATIONS

Machine translation of Lee et al. German Patent Document DE 102019118515 A1 Apr. 2020 (Year: 2020).*

* cited by examiner

*Primary Examiner* — Kevin J Comber
(74) *Attorney, Agent, or Firm* — KW Law, LLP

(57) ABSTRACT

A method of clamping a voltage includes providing a fin-based field effect transistor (FinFET) device. The FinFET device includes an array of FinFETs. Each FinFET includes a source contact electrically coupled to a fin and a gate contact. The method also includes applying the voltage to the source contact and applying a second voltage to the gate contact. The voltage is greater than the second voltage. The method further includes increasing the voltage to a threshold voltage and conducting current from the source contact to the gate contact in response to the voltage reaching the threshold voltage.

20 Claims, 13 Drawing Sheets

Pitch
P
Width
W
112
116
110
124
122
114
Array
Length
AL
110
110
Space S
122
A
A'
110
Fin Length
L
Array Width AW
y
x

METHOD AND SYSTEM FOR A FIN-BASED VOLTAGE CLAMP

CROSS-REFERENCES TO RELATED APPLICATIONS

This application is a continuation application of U.S. patent application Ser. No. 18/137,314, filed Apr. 20, 2023, and entitled "Method and System for Fin-Based Voltage Clamp," which claims priority to U.S. Provisional Patent Application No. 63/335,299, filed Apr. 27, 2022, and entitled "Method and System for Fin-Based Voltage Clamp," both of which are hereby incorporated by reference in their entirety.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral (e.g. a typical gallium nitride high electron mobility transistor (HEMT)).

III-nitride materials, and in particular, gallium nitride (GaN) substrates, allow vertical field effect transistory (FET)-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Electrostatic discharge protection becomes increasingly important as the sizes of structures produced using semiconductor fabrication technology are reduced. Despite the progress made in the field of electronics and electrostatic discharge protection, there is a need in the art for improved methods and systems related to electronics and electrostatic discharge protection.

SUMMARY OF THE INVENTION

The present invention generally relates to the field of electronics, and more specifically to semiconductor manufacturing technology. In a particular embodiment, structures and methods of forming a voltage clamp using elements of a fin-based field effect transistor (FinFET) are provided. As an example, an electrical surge clamp using a lateral reverse bias conduction mechanism in a GaN n-type fin to a p-type gate structure is provided. In some embodiments, voltage clamps utilizing structures not including fin-based structures are utilized. Embodiments of the present invention are applicable to a variety of different vertical FET structures and gate-source connections.

According to an embodiment of the present invention a method of clamping a voltage is provided. The method includes providing a fin-based field effect transistor (FinFET) device. The FinFET device includes an array of FinFETs, each FinFET comprising: a source contact electrically coupled to a fin; and a gate contact. The method also includes applying the voltage to the source contact, applying a second voltage to the gate contact, wherein the voltage is greater than the second voltage, increasing the voltage to a threshold voltage, and conducting current from the source contact to the gate contact in response to the voltage reaching the threshold voltage.

In an embodiment, the method further includes forming a neutralized region, wherein the source contact is electrically coupled to the neutralized region and the neutralized region is electrically coupled to a gate region. Each FinFET can further include a central region characterized by a first electrical conductivity and fin tips characterized by a second electrical conductivity less than the first electrical conductivity. The central region can include a neutralized region including traps. Each FinFET can further include a first central gate region disposed on a first lateral side of the fin and a second central gate region disposed on a second lateral side of the fin, wherein the first central gate region and the second central gate region are characterized by a third electrical conductivity. An area of each of the fin tips can be between 1% and 10% of an area of fin. The fin tips can have a tip length and a ratio of a fin length to the tip length is greater than 10:1, greater than 25:1, or greater than 100:1. Conducting current from the source contact to the gate contact can include conducting current through the neutralized region. Conducting current through the neutralized region can include conducting current through the central region. Conducting current through the neutralized region can include field induced enhancement of variable range hopping between the traps in the neutralized region. The neutralized region can be defined by a lateral neutralized dimension greater than a depth of the neutralized region. The fin tips can include a neutralized region including traps. The neutralized region can include an ion implanted region. The second voltage can be ground. The current can increase by a factor of 10 or greater over a voltage range less than 3% of the threshold voltage or over a voltage range less than 1% of the threshold voltage. The FinFET device can include a gate region disposed between adjacent fins in the array of FinFETs and the gate contact can be electrically coupled to the gate region. The source contact can be an anode and the gate contact can be a cathode while conducting current from the source contact to the gate contact. The FinFET device can include a III-N semiconductor, for example, GaN.

According to another embodiment of the present invention, an integrated electronic device is provided. The integrated circuit device includes a first array of first FinFETs, each first FinFET comprising: a first source contact; and a common gate contact. The integrated circuit device also includes a voltage clamp comprising: a second array of second FinFETs, each second FinFET comprising: a second source contact configured to receive a voltage; and a second gate contact, wherein the voltage clamp is configured to conduct a current from the second source contact to the second gate contact in response to the voltage reaching a threshold voltage.

Each first FinFET can further include a central region characterized by a first electrical conductivity and fin tips characterized by a second electrical conductivity less than the first electrical conductivity. The central region can include a neutralized region including traps. The neutralized region can include an ion implanted region. Each first FinFET can further include a first central gate region disposed on a first lateral side of a fin and a second central gate region disposed on a second lateral side of the fin, wherein the first central gate region and the second central gate region are characterized by a third electrical conductivity. An area of each of the fin tips can be between 1% and 10% of an area of fin. The fin tips can have a tip length and a ratio of a fin length to the tip length is greater than 10:1, greater than 25:1, or greater than 100:1. The first source contact can be defined by a lateral source dimension and the neutralized region can be defined by a lateral neutralized dimension greater than a depth of the neutralized region. The voltage can be ground. Each second FinFET can include a gate region disposed between adjacent fins in the second array of second FinFETs; and the second gate contact can be electrically coupled to the gate region. The second source contact can be an anode and the second gate contact can be a cathode while conducting current from the second source contact to the second gate contact. The second FinFET can include a III-N semiconductor, for example, GaN.

According to a particular embodiment of the present invention, an electronic device is provided. The elctronic device includes a substrate characterized by a first conductivity type and a first electrical conductivity, a neutralized region coupled to the substrate and characterized by a second electrical conductivity less than the first electrical conductivity, a first contact in electrical communication with the neutralized region, and a second contact in electrical communication with substrate.

Application of a first voltage to the first contact and of a second voltage to the second contact, wherein the first voltage is greater than the second voltage by a threshold voltage, can result in current flow from the first contact to the second contact. The second voltage can be ground. The first conductivity type can be p-type. The neutralized region can include an ion implanted portion of the substrate. The substrate can include a III-N semiconductor, for example, GaN.

Numerous benefits are achieved by way of the present disclosure over conventional techniques. For example, embodiments of the present disclosure provide methods and systems that provide voltage clamps that can be integrated with a FinFET array or utilized as standalone devices. Implementing voltage clamps as described herein may protect a FinFET device from high currents that may be caused by an electrostatic discharge (ESD) event. The voltage clamps may be fabricated on the same die as the FinFET device, which may allow for a single integrated circuit device that provides the functionality of both the FinFET device and the voltage clamp. These and other embodiments of the disclosure, along with many of its advantages and features, are described in more detail in conjunction with the text below and corresponding figures.

DETAILED DESCRIPTION OF SPECIFIC EMBODIMENTS

Figure 1:
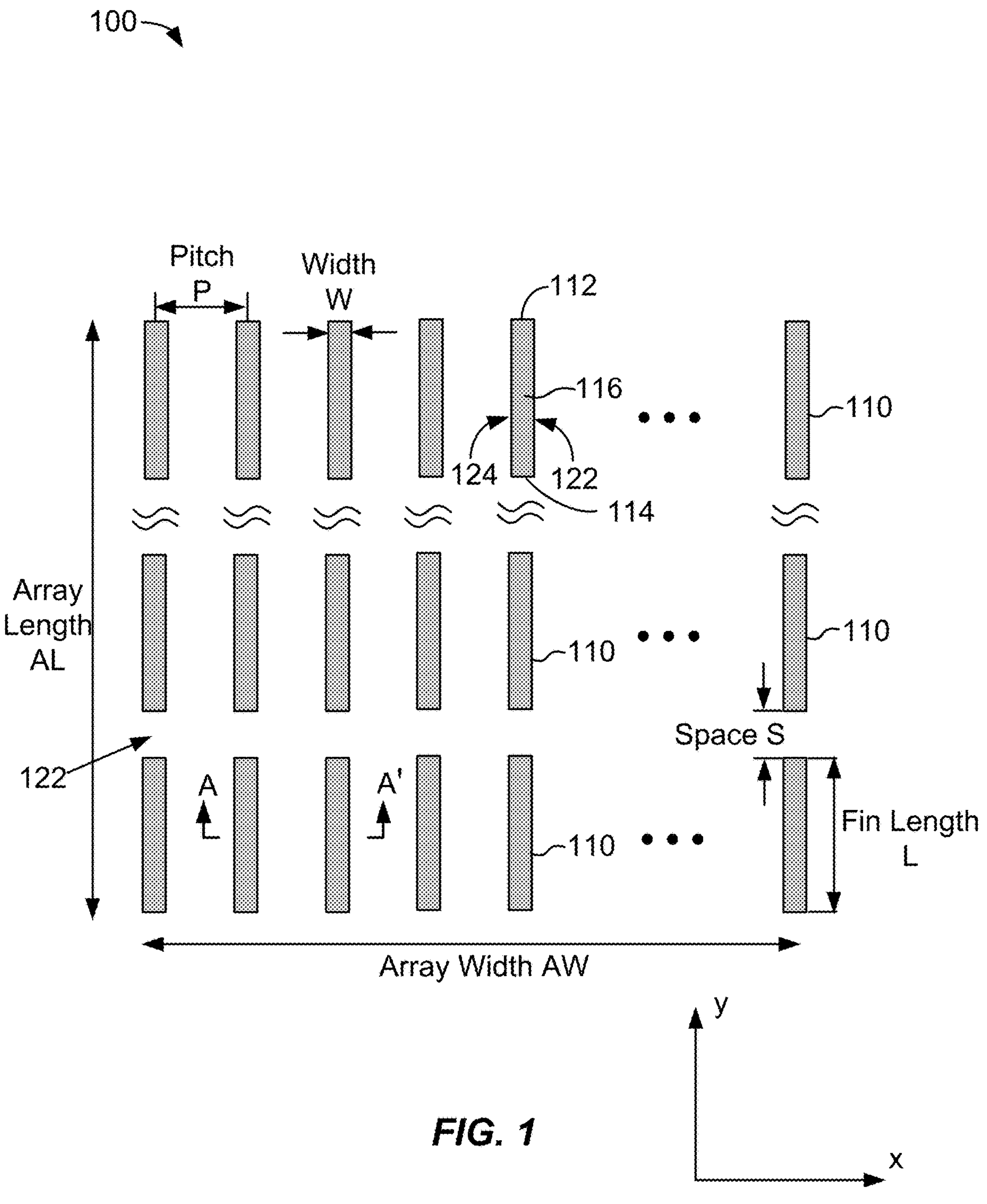
FIG. 1 is a plan view schematic diagram illustrating an array of fins surrounded by a gate region according to an embodiment of the present invention.

The present invention generally relates to the field of electronics, and more specifically to semiconductor manufacturing technology. In a particular embodiment, structures and methods of forming a voltage clamp using elements of a fin-based field effect transistor (FinFET) are provided. As an example, an electrical surge clamp using a lateral, reverse bias conduction mechanism in a GaN n-type fin to a p-type gate structure is provided. In some embodiments, voltage clamps utilizing structures not including fin-based structures are utilized. Embodiments of the present invention are applicable to a variety of different vertical FET structures and gate-source connections.

Power transistors that can withstand high voltages (>600 V) are becoming popular in applications such as industrial and commercial power supplies, solar inverters, and electric vehicle (EV) power trains.

In addition, in order to reduce the resistance of the switch and reduce parasitic capacitances, etc., that limit switch speed, an increased conductance per unit area is desirable. Switch transistors in which the current flow is primarily vertical offer reduced resistance per area. This benefit can be further improved by arranging the control channel of the transistor to lie in the vertical direction, e.g., a "trench" channel transistor. The resistance of the transistor has several components, including the resistance of the transistor channel (i.e., the region where current is directly controlled by the input gate voltage), the resistance of the "drift" region (i.e., the region designed to hold the breakdown voltage of the transistor), and the resistance of the starting substrate, contacts, metals, etc.

Transistors with vertical current flow are typically designed with the drain contact at the bottom surface of the chip, and the gate and source contacts at the top surface of the chip.

In order to maximize the switch conductivity (i.e., minimize the switch resistance) and provide a uniform transient response for the device, the transistor may be fabricated using an array of many small, vertical-channel switch devices surrounded by control gates, which can be referred to as an array of "gate-all-around" transistors. The finished device has all sources connected to a single electrode, a common gate electrode, and a drain electrode.

Improvements in switch resistance and capacitance can be made by changing the semiconductor material from silicon to a wide bandgap material such as gallium nitride, which offers a higher critical field for breakdown. Additionally, this change allows the high-voltage drift region of the device to be made thinner and more heavily doped than with similar silicon devices, reducing the "specific resistance" (i.e., the resistance X area) of the drift region, and reduces the device on-resistance for a given die size.

A vertical FET transistor structure is described in U.S. Pat. No. 9,117,839 (Kizilyalli, et al.) (the "'839 structure"), the disclosure of which is hereby incorporated by reference in its entirety for all purposes. In the '839 structure, the transistor conducting channel is formed using a semiconductor "fin" created by patterning and etching surrounding material to a certain depth. A semiconductor material with an opposite doping type is epitaxially regrown (e.g., using metalorganic chemical vapor deposition (MOCVD)) to be substantially planar to the top of the semiconductor "fin." The regrown material serves as the gate electrode of a vertical FET, and application of control voltages to the gate electrode modulates the conduction of current in the vertical "fin" channel between the top of the fin ("source") and bottom of the fin (normally, the drift region which is further connected to the "drain" electrode via the semiconductor substrate).

In the '839 structure, the regrown gate material surrounds the fin. An array of fins can be fabricated with a common gate using this approach, with, for example, fins arranged in a number of rows and columns so that the total number of transistors achieves the desired on-resistance target for the final device.

As mentioned above, the array of FinFETs includes a number of rows and columns of separated fins. Each of the separated fins has a length and a width measured laterally with respect to the length. A first fin tip is disposed at a first end of the separated fin, whereas a second fin tip is disposed at a second end of the separated fin opposing the first end. The first fin tip and the second fin tip are also referred to as the fin tips of the separated fin. A central region of the separated fin is disposed between the first fin tip and the second fin tip.

In vertically regrown JFETs, the fin tips are a source of non-uniformity. First, the fin tips are defined by the combination of multiple planes. For best regrowth quality, the fin patterns are crystallographically aligned to the m-plane. But at the fin tips, the regrowth quality may be impacted due to growth on planes other than the m-plane. This variation in regrowth characteristics may cause a higher junction leakage between the gate and the source than desired.

Second, since fin tips are defined by the combination of multiple planes, the tetramethylammonium hydroxide (TMAH) crystallographic etch can cause varying height at fin tips. This can cause regrown epitaxial overgrowth at fin tips and higher gate-source junction leakage.

Third, the uniformity of both the lithography process and the etch processes can vary significantly between a region with a regular pattern and a region with a sparse pattern. Such a transition occurs at the edges of the array of fins. For example, the presence of a large, sparse area next to a regular array can lead to differences in exposure dose due to proximity effects, which will cause the resist linewidth to vary between the center of the array and the edges of the array, with resulting increase in the electrical variation of the fin devices near the edge of the array. For example, the presence of a large sparse pattern area next to a regular pattern array can lead to differences in etch rate caused by variation in the amount of etchant consumed in the sparse pattern region vs. the amount consumed in the regular pattern array. Due to the difference in local pattern density (sparse patterns vs. dense patterns) at fin tips, there are non-uniformities in dry etch due to different micro-loading. This can cause the overgrowth of the regrown epitaxial material and lead to higher gate-source junction leakage.

FIG. 1 is a plan view schematic diagram illustrating an array of fins surrounded by a gate region according to an embodiment of the present invention. In FIG. 1, the array of fins 100 is illustrated and, for purposes of clarity, the gate metal is not shown. Further examples of arrays of fins suitable for FinFET arrays, including other layout concepts, may be found in U.S. Patent Application Publication No. 2021/0210624, the disclosure of which is hereby incorporated by reference in its entirety for all purposes.

In the example shown in FIG. 1, each of the separated fins 110 has a first fin tip 112 disposed at a first end and a second fin tip 114 disposed at a second end opposing the first end. A central region 116 is disposed between the first fin tip 112 and the second fin tip 114. A first central gate region 122 is disposed on a first lateral side (the right side in this example) of the separated fins 110, while a second central gate region 124 is disposed on a second lateral side (the left side in this example) of the separated fins 110. In the embodiments, described herein, lateral dimensions are dimensions in the plane of FIG. 1, i.e., in the x-y plane.

Referring to FIG. 1, the pitch P between separated fins 110, the width W of the separated fins 110, the spacing S between rows of separated fins 110, and the length L of the separated fins 110 are illustrated. The rows and columns of separated fins 110 form the array of fins 100, which is defined by an array width AW and an array length AL.

The length of the fin tip can be related to the length of the fin. As an example, the length of the first fin tip 112 and the second fin tip 114 can be on the order of 1 μm for fins with a length L of 25 μm, resulting in the length of the fin tip being 4% of the fin length. Thus, in this embodiment, the combined length (i.e., 2 μm) of the fin tip at the end of the fin is 8% of the fin length L. In other embodiments, the length of the fin tip is shorter than 1 μm, for example, in the range of 0.2 μm to 0.4 μm, resulting in the combined fin tips at the end of the fin being between 1.6% and 3.2%. In some embodiments, the ratio of the fin tip length to the fin length L is between 1% and 10%. As described more fully herein, the fin tips are neutralized in order to reduce the electrical conductivity at the interface between the fin tip and the gate material laterally adjacent to the fin tip. The inventors have determined that lengths of the fin tip greater than to equal to about 0.05 μm, 0.1 μm, 0.2 μm, 0.3 μm, 0.4 μm, 0.5 μm, 0.75 μm, 1 μm, or 2 μm provide a sufficient decrease in electrical conductivity. Concurrently, the length of the fin tip is short enough to not significantly impact the power capabilities of the FinFET in an adverse manner.

Figure 2A:
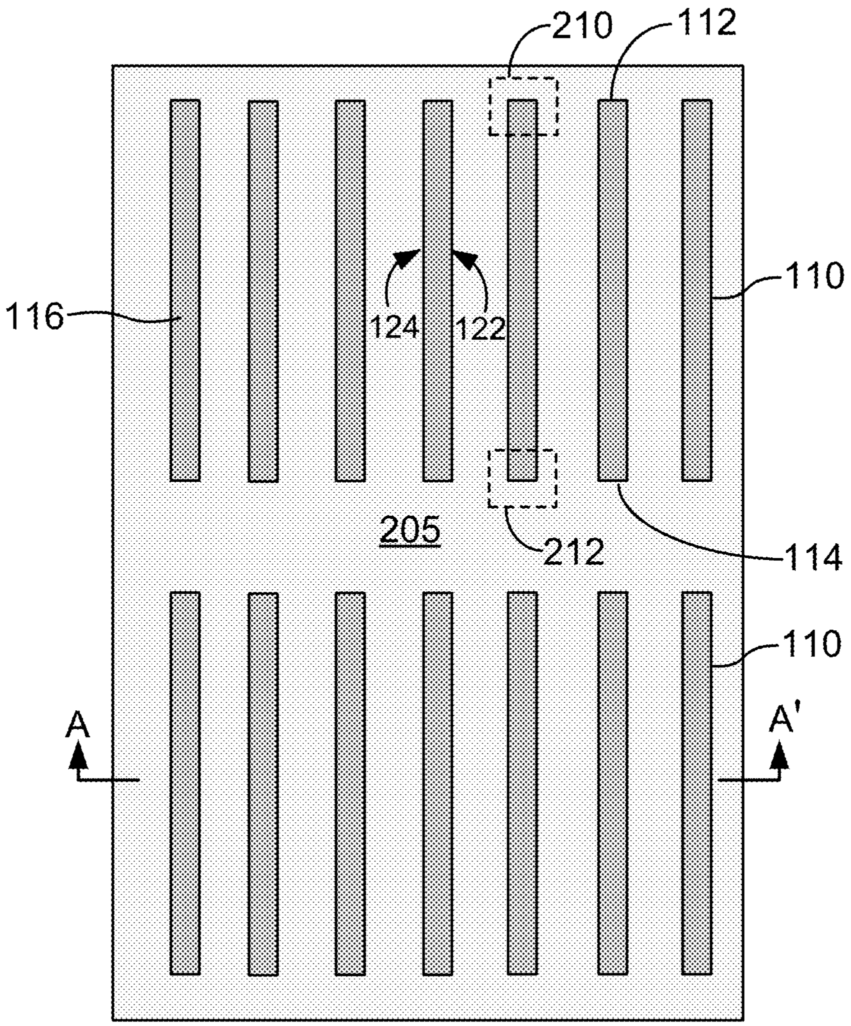
FIG. 2A is a plan view schematic diagram illustrating a layout of a fin array after regrowth of a III-nitride layer according to an embodiment of the present invention.

FIG. 2A is a plan view schematic diagram illustrating a layout of a fin array after regrowth of a III-nitride layer according to an embodiment of the present invention. During the fabrication of the fin array illustrated in FIG. 2A, the array of fins 100 illustrated in FIG. 1 is utilized and a III-nitride layer is regrown to form gate region 205 surrounding the separated fins 110. At this stage of the fabrication process, and prior to ion implantation to neutralize the first fin tips 112, the first gate regions 210 surrounding the first fin tips 112, the second fin tips 114, and the second gate regions 212 surrounding the second fin tips, the electrical conductivity in the separated fins 110 does not vary. The electrical conductivity in the gate region does not vary either. In other words, the first fin tip 112, the second fin tip 114, and the central region 116 of each separated fins 110 have the same electrical conductivity, while the first gate regions 210, the second gate regions 212, the first central gate region 122, and the second central gate region 124 have the same electrical conductivity.

Figure 2B:
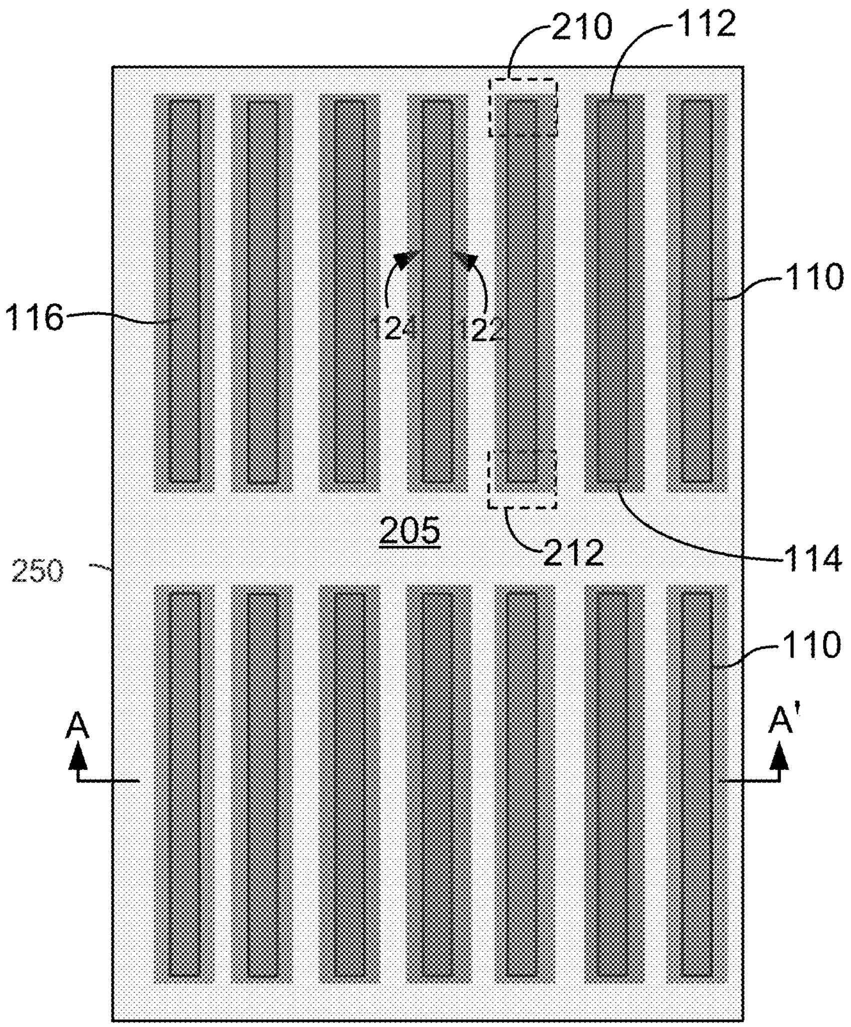
FIG. 2B is a plan view schematic illustrating a layout of a fin array after formation of a source contact isolation region according to an embodiment of the present invention.

FIG. 2B is a plan view schematic illustrating a layout of a fin array after formation of a source contact isolation region according to an embodiment of the present invention. During the fabrication of the fin array illustrated in FIG. 2B, after the regrowth of the III-nitride layer illustrated in FIG. 2A, a contact isolation region 250, also referred to as a source contact isolation region, is formed around the fin. This contact isolation region serves as an insulation region between the source contact metal and the p-GaN gate material during normal bias conditions (e.g., from a gate-to-source voltage of −20V to +5V). In an embodiment, the contact isolation region and method of formation thereof utilizes a neutralizing implant as described in US Patent Application Publication No. 2022/0020743, the disclosure of which is hereby incorporated by reference in its entirety for all purposes. In another embodiment, the contact isolation region may be formed using a deposited dielectric such as silicon nitride, silicon dioxide, or the like. In another embodiment, the contact isolation region may be formed by a localized plasma bombardment (e.g., using an Ar plasma) or a localized reactive ion etch process (e.g., using Cl-based chemistry) that damages the p-GaN to a predetermined depth below the surface, thereby decreasing the conductivity of the p-GaN.

The inventors have determined that the fin tips can be a source of non-uniformity, resulting in higher junction leakage, including higher leakage through the isolation region. Accordingly, embodiments of the present invention utilize a neutralizing ion implantation (e.g., a second neutralizing implant) to reduce the conductivity of the first fin tips 112, the first gate regions 210 surrounding the first fin tips, the second fin tips 114, and the second gate regions 212 surrounding the second fin tips in order to reduce the junction leakage. As described more fully herein, once the junction leakage has been reduced as a result of neutralization of the fin tips, a conduction mechanism is provided between the source contact of the n-type fin and the p-type gate region of the FinFET device when the source contact and the gate region are placed in reverse bias. In some embodiments, the drain of the FinFET is left floating.

Figure 3:
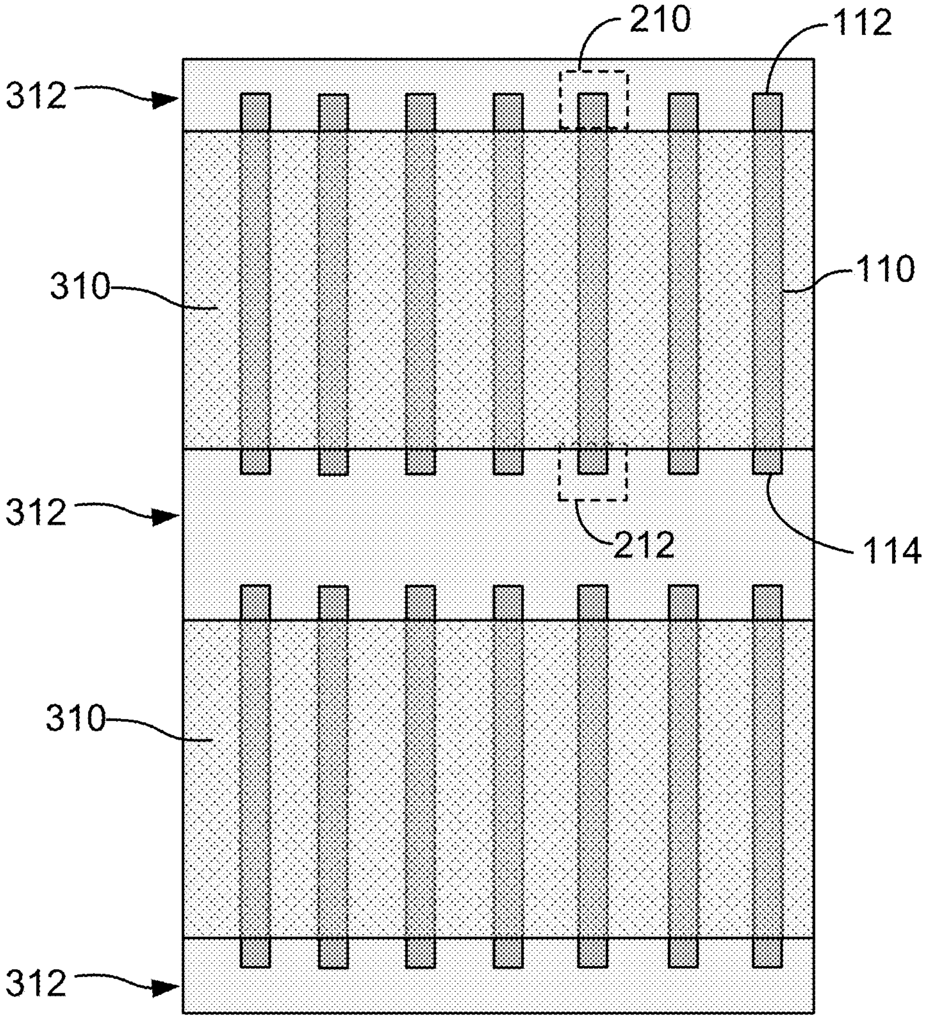
FIG. 3 is a plan view schematic diagram illustrating a layout of a fin array with an overlying implant mask according to an embodiment of the present invention.

FIG. 3 is a plan view schematic diagram illustrating a layout of a fin array with an overlying implant mask according to an embodiment of the present invention. Using implant mask 310, the central region of each of the rows of separated fins 110 is covered, as well as the gate material between the central regions of the separated fins 110. The implant mask 310 has openings 312 that expose the first fin tips 112, the first gate regions 210 surrounding the first fin tips 112, the second fin tips 114, and the second gate regions 212 surrounding the second fin tips 114. In some embodiments, implant mask 310 is formed from a photo-sensitive material such as photoresist. In other embodiments, other suitable mask layers can be formed and patterned to form other suitable masks as appropriate to the particular application. Accordingly, a mask formed using a photo-sensitive material is merely exemplary and other masks fabricated using other materials are included within the scope of the present invention.

Regions of the fin array not covered by implant mask 310 receive a deep neutralization implant, to a depth between 70% and 100% of the fin height. This deep neutralization implant reduces the electrical conductivity of the implanted regions, which can correspond, in some embodiments, to a reduced doping density. Thus, the first fin tips 112 and the second fin tips 114 are characterized by a second electrical conductivity less than the electrical conductivity of the central regions covered by implant mask 310. The first gate regions 210 and the second gate regions 212 are also characterized by an electrical conductivity less than the electrical conductivity (e.g., the doping density) of the first central gate region 122 and the second central gate region 124 illustrated in FIG. 2A. Additional description related to the deep neutralization implants is provided in U.S. patent application Ser. No. 18/097,693, filed on Jan. 17, 2023, the disclosure of which is hereby incorporated by reference in its entirety for all purposes.

The formation of neutralized regions can be performed using ion implantation to neutralize the region of interest, including the fin tips and the gate regions surrounding the fin tips. In areas where the implant mask is present, for example, the central region of the fins, the ion implantation is blocked, for example, not reaching the central regions, the source contacts electrically coupled to the central regions, and the central gate regions. In areas where the implant mask is not present and the device structure is exposed, for example, the fin tips and the gate regions laterally adjacent the fin tips, the ion implantation reaches these exposed areas. As a result of the ion implantation, the interface between the fin tips and the gate material laterally adjacent to the fin tips is neutralized, which reduces the electrical conductivity at this interface, thereby reducing leakage. As discussed herein, neutralization does not require that the conductivity of the semiconductor material is equal to that of undoped material, rather, it includes reductions in conductivity compared to the conductivity of the material prior to a neutralization process. Thus, starting with a given doping level and initial conductivity in the second III-N layer making up the fins, the neutralization processes described herein can reduce the conductivity to a value lower than the value of the initial conductivity.

Neutralizing the fin tips as described herein reduces the electrical conductivity of the fin tips and the area laterally adjacent the fin tips, thereby reducing their electrical activity or making them electrically inactive, resulting in many advantages. First, the junction leakage is significantly reduced. Second, the complexity of the masking step, the implant step, and the photoresist strip step are low. Third, implant energies are well controlled and can be easily modified to achieve any desired neutralization depth. Fourth, this implant can be combined with an existing implant step of the right implant energy, making the whole process flow very efficient. Fifth, undesired leakage through the contact isolation region 250 illustrated in FIG. 2B is reduced or eliminated at the fin tip.

The ion implantation processes used herein implant ionic species to increase the resistivity (i.e., decrease the conductivity) of predetermined portions of the semiconductor layer to provide a spatial variation or modulation in the conductivity. Without limiting embodiments of the present invention, the it is believed that the implantation process reduces the conductivity by at least one of the following mechanisms: compensating for dopants, annihilating dopants, increasing vacancy density, increasing void density, decreasing the total net charge in the epitaxial layer, or decreasing the density of ionized acceptors (donors for n-type material). Some or all of these mechanisms may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. The present invention is not limited by the physical mechanism resulting in the spatial conductivity modulation. Additionally, the mechanisms associated with ion implantation are also applicable to diffusion processes and hydrogen plasma treatments are appropriate.

In one embodiment, the neutralization process is an ion implantation process during which a neutralizing species is implanted into the areas exposed by the mask openings. The neutralizing species may be N, Ar, He, Si, or O, other suitable implant ions, or combinations thereof. In an embodiment, the dose of the neutralizing species is between $1\times10^{11}$ $cm^{-2}$ and $5\times10^{13}$ $cm^{-2}$. In an embodiment, the energy of the implantation is between 15 KeV and 700 KeV. In an embodiment, the energy of the implant for N is less than 500 KeV. In an embodiment, the energy of the implant for He is less than 200 KeV. In an embodiment, the energy of the implant for He is less than 170 KeV. In some embodiments, ion implantations with multiple energies are performed. In some embodiments, each of those ion implantations with multiple energies may have a different dose.

It should be understood that although ion implantation is used as an example neutralization process, this is not intended to be limiting. In another embodiment, the neutralization process is a hydrogen plasma treatment process, which deactivates the dopant atoms in the p-GaN layer.

Figure 4:
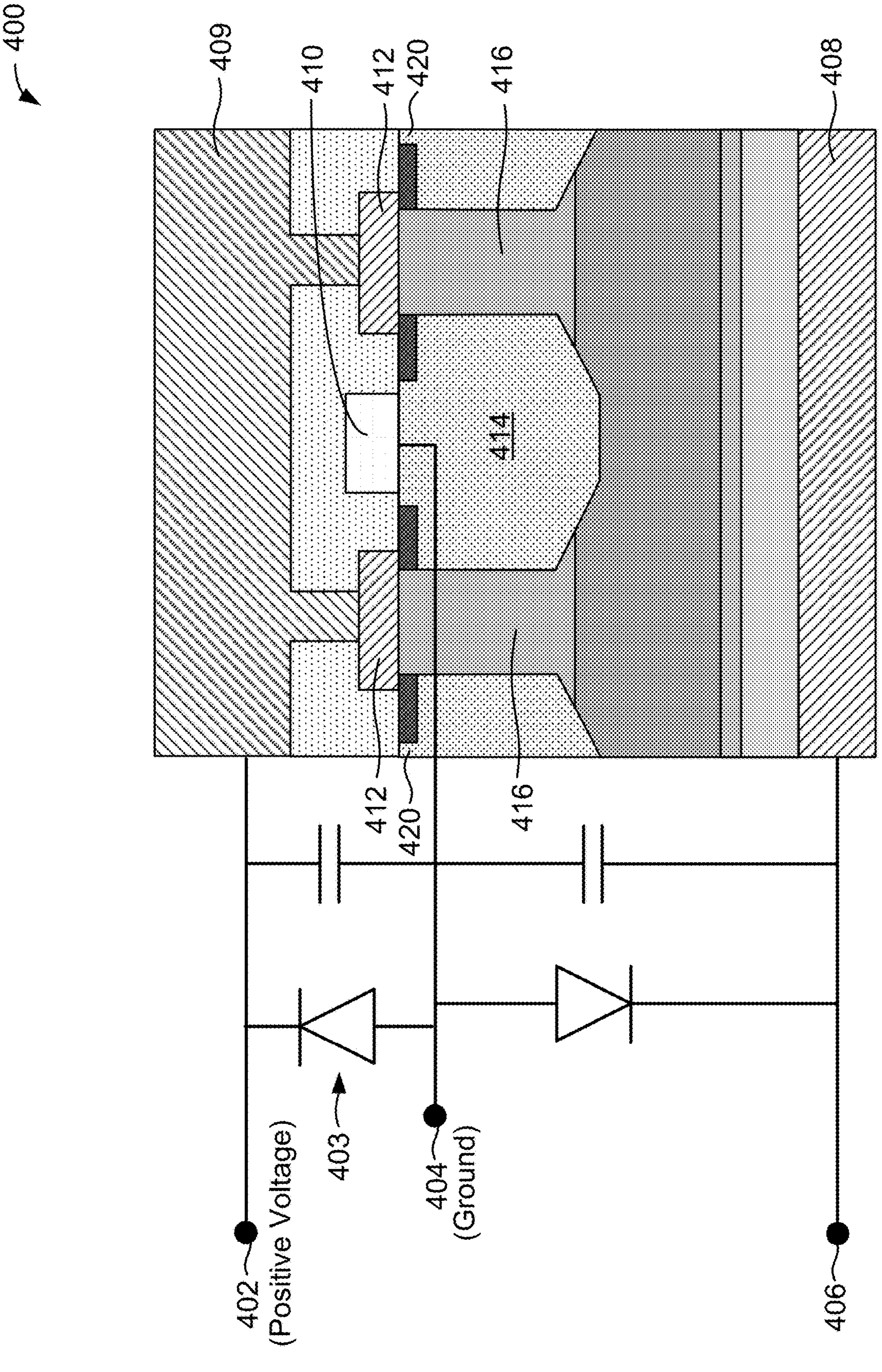
FIG. 4 is a simplified cross-sectional schematic diagram of a set of FinFETs and a corresponding circuit diagram according to an embodiment of the present invention.

FIG. 4 is a simplified cross-sectional schematic diagram of a set of FinFETs and a corresponding circuit diagram according to an embodiment of the present invention. The cross-sectional schematic diagram illustrated in FIG. 4 corresponds to cross-section A-A' in FIG. 1 and cross-section A-A' in FIG. 2A. Referring to FIG. 4, a portion 400 of an array of FinFETs is illustrated, with the array including fins 416 and gate region 414 disposed between adjacent fins. Source contact 412 is electrical contact with each of the fins 416 and gate contact 410 is in electrical contact with the gate region 414. Source contact 412 is further in contact with source isolation region 420 (corresponding to contact isolation region 250 illustrated in FIG. 2B), and source isolation region 420 is in contact on the lower side and laterally with gate region 414. The drain 408 of the array of FinFETs and the source metal 409 are also illustrated.

Referring to FIG. 4, the circuit diagram includes source node 402, gate node 404, and drain node 406. During operation in which source node 402 is placed at a higher voltage than gate node 404, for example, if gate node 404 is grounded and source node 402 is at a positive voltage, source contact 412, fins 416, which are fabricated using n-type semiconductor material, and gate contact 410, which is in electrical contact with p-type gate material, will form a reverse bias diode illustrated by diode 403. In some embodiments, drain 408 and drain node 406 are floating, with no current flow between gate contact 410, which can be grounded, and drain node 406.

The inventors have determined that current conduction between the source node 402 and the gate node 404, when diode 403 is in reverse bias, can be utilized to implement voltage surge protection, including ESD protection. This voltage surge protection can be implemented using elements of a FinFET device, enabling use in the context of a FinFET device or separately.

Figure 5A:
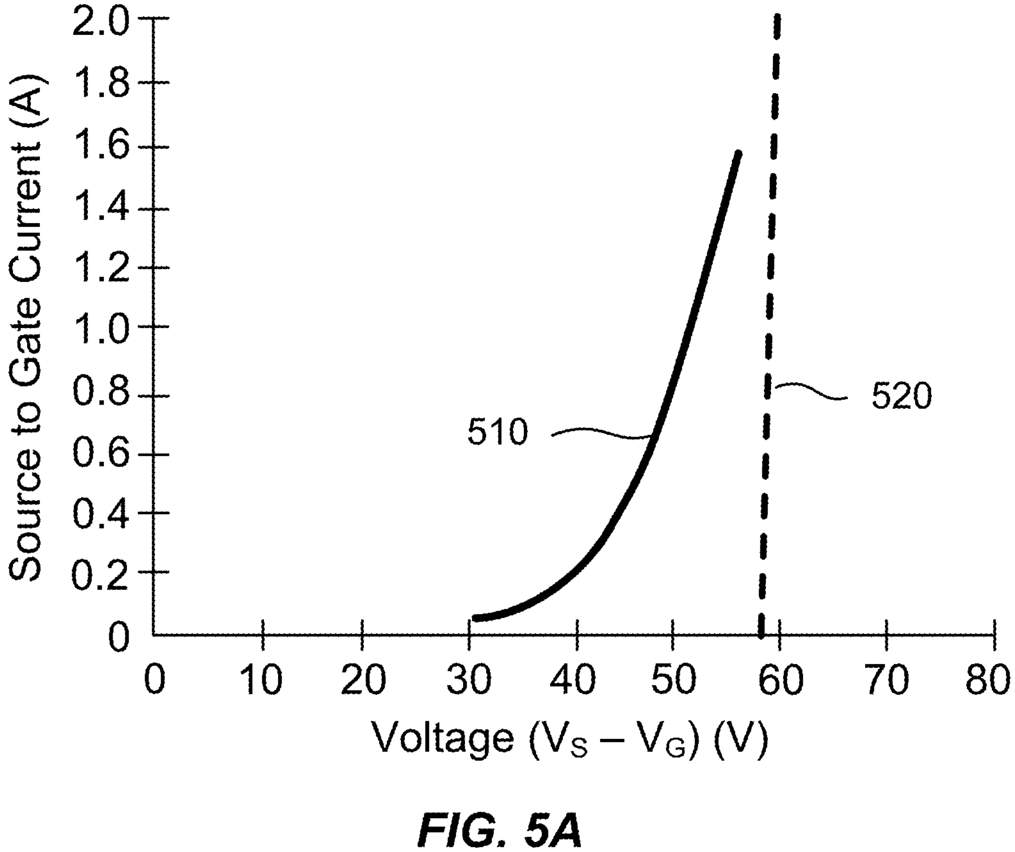
FIG. 5A is a plot illustrating current-voltage curves for a conventional device and a device provided according to an embodiment of the present invention, respectively.

FIG. 5A is a plot illustrating current-voltage curves for a conventional device and a device provided according to an embodiment of the present invention, respectively. As illustrated in FIG. 5A, the current flowing from the source node to the gate node is illustrated as a function of the voltage applied to the source node (Vs) in comparison to the voltage applied to the gate node (VG). Since the source node voltage Vs is positive and the gate is grounded in this example, diode 403 illustrated in FIG. 4 is operated in reverse bias. The I-V curve 510 for a conventional device, utilizing an implanted source isolation region but without neutralized fin tips, illustrates current flow beginning at ~30 V, with the current flow gradually increasing, reaching ~1 A at a voltage of ~50 V. As the voltage is increased above ~55 V, the conduction between the source node and the gate node abruptly increases, but is unable to sustain currents above 2 A without destructive failure (i.e., break down).

In contrast, the I-V curve 520 for a device provided in accordance with embodiments of the present invention, utilizing an implanted source isolation region and further including neutralized fin tips, demonstrates substantially no current flow for voltages exceeding 50 V, and a rapid current increase as the voltage at the source node reaches ~58 V. As illustrated in FIG. 5A, an increase in current from 0 A to 2 A occurs as the voltage at the source node increases from ~58 V to ~60 V. In contrast with break down at a current of less than 2 A characteristic of a conventional device, embodiments of the present invention support currents an order of a magnitude larger prior to break down.

Figure 5B:
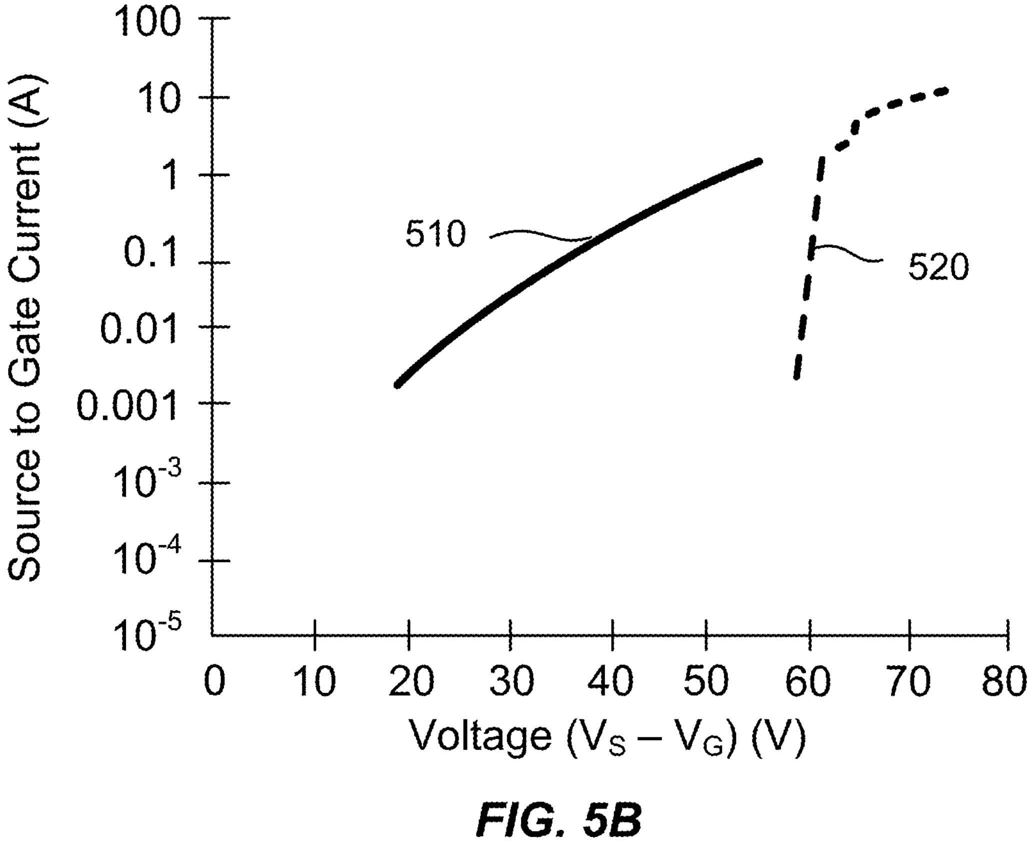
FIG. 5B is a semi-log plot showing the current-voltage curves illustrated in FIG. 5A.

FIG. 5B is a semi-log plot showing the current-voltage curves illustrated in FIG. 5A. As illustrated in FIG. 5B, the current flow for the conventional device is represented by a substantially linear relationship in this semi-log plot, increasing from a current of ~0.01 A at a reverse bias voltage of ~20 V to a current of ~1 A at a reverse bias voltage of ~50 V. In contrast, the device provided according to an embodiment of the present invention, for example, a device as illustrated in FIG. 4, has a significantly higher slope for voltages of ~60 V to 62 V. Current flow of ~20 A was observed for operation at a reverse bias voltage of ~75 V. Whereas a conventional device is characterized by an order of magnitude increase in current for an increase in voltage of ~15 V, embodiments of the present invention are characterized by an increase in current by an order of magnitude for an increase in voltage of ~1 V.

Figure 6A:
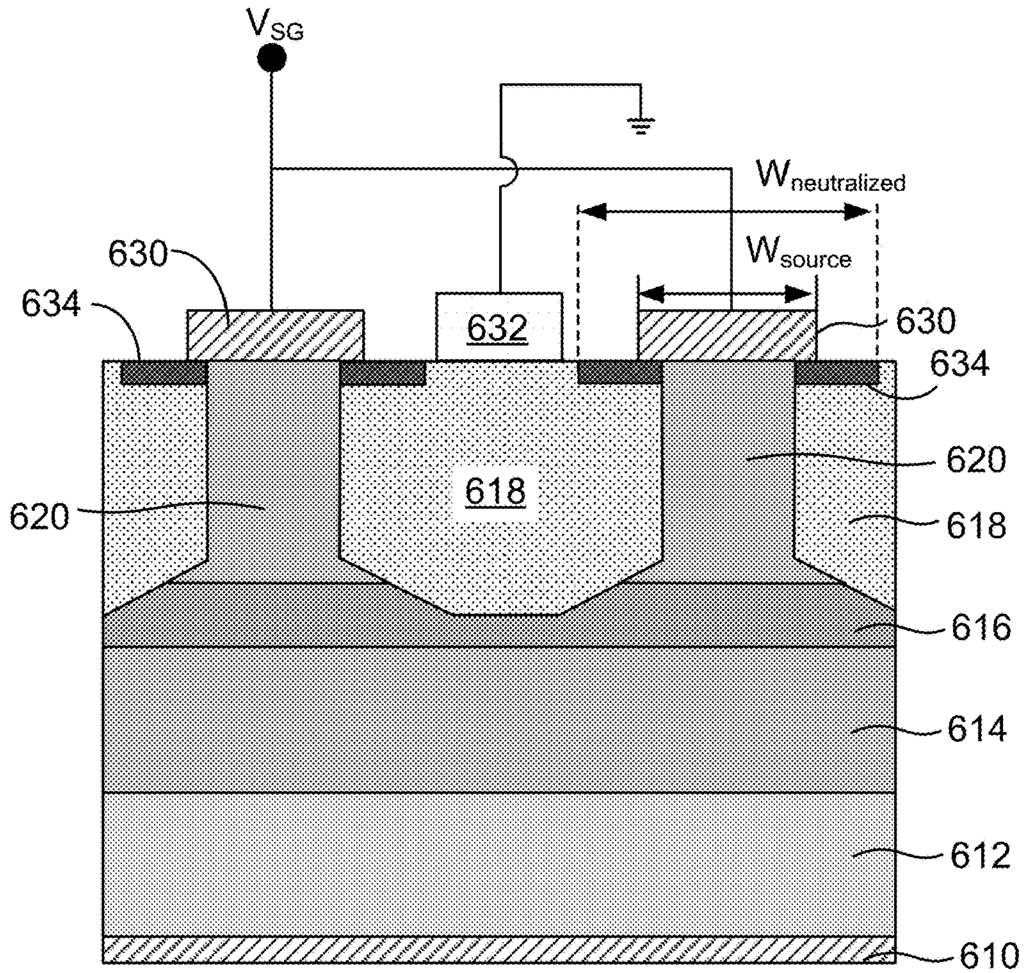
FIG. 6A is a simplified cross-sectional schematic diagram of a set of FinFETs and corresponding circuit wiring according to an embodiment of the present invention.
Figure 6B:
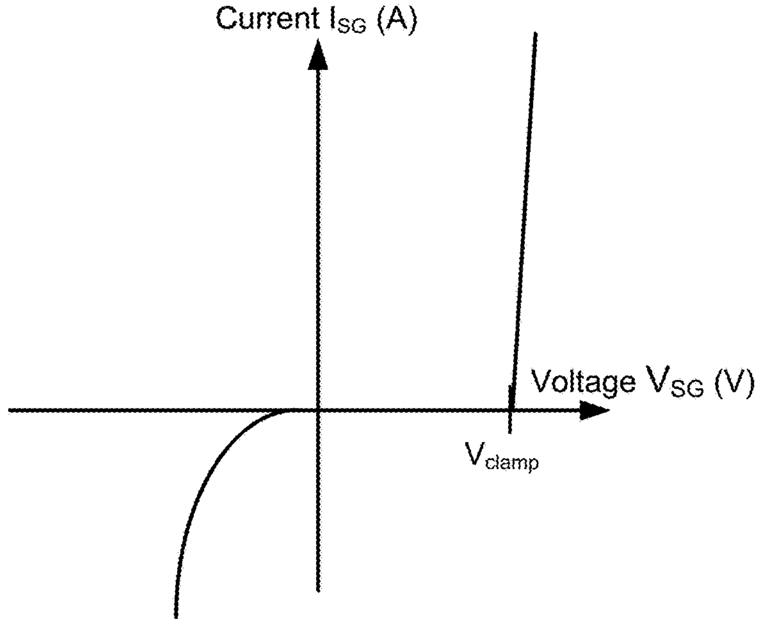
FIG. 6B is a plot illustrating current-voltage characteristics for the set of FinFETs illustrated in FIG. 6A.

FIG. 6A is a simplified cross-sectional schematic diagram of a set of FinFETs and corresponding circuit wiring according to an embodiment of the present invention. FIG. 6B is a plot illustrating current-voltage characteristics for the set of FinFETs illustrated in FIG. 6A. The cross-sectional schematic diagram illustrated in FIG. 6A corresponds to cross-section A-A' in FIG. 1 and cross-section A-A' in FIG. 2A. As illustrated in FIG. 6A, lateral clamp structures can be implemented using existing FinFET process flows and structures.

Referring to FIG. 6A, a substrate 612 supports a drift layer 614, and a graded doping layer 616. Fins 620 formed from a channel layer (not shown) and a gate region 618 are also illustrated. Source contact 630 is in electrical contact with each of the fins 620 and gate contact 632 is in electrical contact with the gate region 618. The drain 610 of the array of FinFETs is also illustrated. The surface of the gate region adjacent to the fin is neutralized, resulting in lower electrical conductivity between source contact 630 and the gate region 618, and gate contact 632.

In an embodiment, substrate 612, drift layer 614, graded doping layer 616, and fins 620 (channel layer) are all n-type material. At low reverse bias (i.e., source contact 630 is at a negative potential relative to gate region 618), very little current passes between the source contact 630 and gate region 618 through gate surface neutralized region 634 because of the low conductivity of the gate surface neutralized region 634. At higher reverse bias (e.g., >10V), the field across the neutralized region is sufficiently high that some current can flow in the region where source contact 630 overlaps gate surface neutralized region 634. When gate surface neutralized region 634 is formed using ion implantation (e.g., using Ar, He, N, or O ions), conduction can occur through variable-range hopping or Poole-Frenkel conduction mechanisms. At sufficiently high reverse bias between source contact 630 and gate region 618, the source contact 630 surface potential is equal to the p-GaN valence band potential, and a high current of electrons can flow from the gate to the source, resulting in a very rapid increase in current with voltage. When the fin tips are not neutralized, parasitic conduction paths occur between source contact 630 and gate region 618, resulting in a more gradual increase of current with voltage starting at lower reverse-bias values (as illustrated by curve 510 in FIG. 5A). When fin tips are neutralized, these parasitic conduction paths are suppressed and a very abrupt turn-on behavior is observed, as illustrated by curve 520 in FIG. 5A. In the embodiment illustrated in FIG. 6A, the width $W_{source}$ of source contact 630 is narrower than the width $W_{neutralized}$ of the gate surface neutralized region 634. In order to avoid parasitic lateral conduction paths between source contact 630 and gate region 618 through gate surface neutralized region 634, which turn on at low reverse bias, the overlap of the width of the neutralized region $W_{neutralized}$ to the width of the source contact $W_{source}$ on each side of the source contact is generally larger than the thickness of the gate surface neutralized region 634. For example, if the gate surface neutralized region 634 has a thickness of 150 nm, the gate surface neutralized region 634 can extend at least 200 nm beyond the source contact 630.

As will be evident to one of skill in the art, since the deep neutralization only occurs in the regions adjacent the fins tips, current flow from source to drain for normal FinFET operation can occur in the central regions of the fins.

In FIG. 6B, the current flowing from the source node to the gate node (i.e., VSG) is illustrated as a function of the voltage applied to the source node in comparison to the voltage applied to the gate node, in the absence of parasitic leakage paths in the reverse bias operation (i.e., with neutralized fin tips). Since the source node voltage is positive and the gate is grounded in this example, positive voltage will result in reverse bias operation while negative voltage will result in forward bias operation. Thus, in FIG. 6B, current flow between the source contact 630 and the gate contact 632 is illustrated, both in forward bias (i.e., negative voltages) and reverse bias (positive voltages).

In forward bias, as the source-to-gate voltage decreases below 0 V, current flow occurs as illustrated in FIG. 6B. This current flow can also be used in a clamping mechanism for negative source voltages with respect to the gate voltage. As discussed in relation to FIGS. 5A and 5B, in reverse bias, as the source-to-gate voltage increases above 0 V, substantially no current flows until the clamp voltage ($V_{clamp}$) is reached. For voltages above $V_{clamp}$, current flow increases rapidly, for example, by an order of magnitude for a voltage increase of less than 1 V, resulting in an I-V behavior characterized by an inverse slope between 500 and 1000 millivolts per decade increase in current.

Figure 6C:
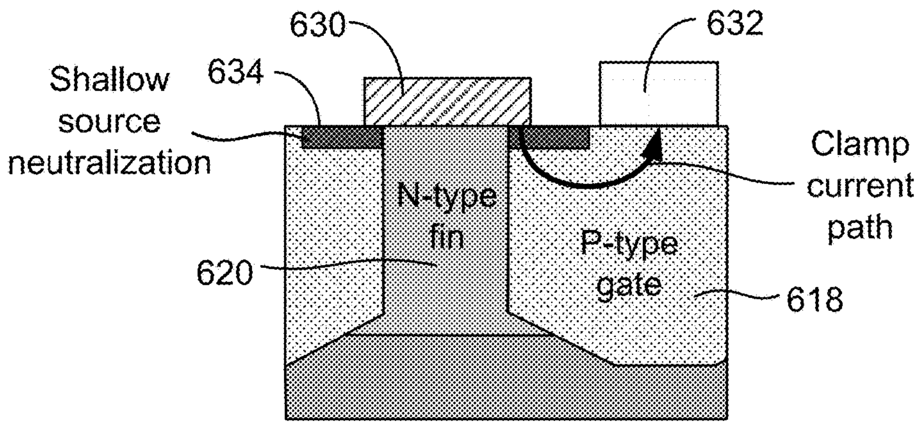
FIG. 6C illustrates the desired current flow in the clamp structure during operation according to an embodiment of the present invention.

FIG. 6C illustrates the desired current flow in the clamp structure during operation according to an embodiment of the present invention. FIG. 6C illustrates a partial cross-section view of the finFET structure shown in FIG. 6A showing the current path during clamp operation. Current initially flows vertically from source contact 630 through that portion of gate surface neutralized region 634 where source contact 630 overlaps gate surface neutralized region 634 to gate region 618. The current then flows laterally and vertically through gate region 618 to gate contact 632.

Figure 6D:
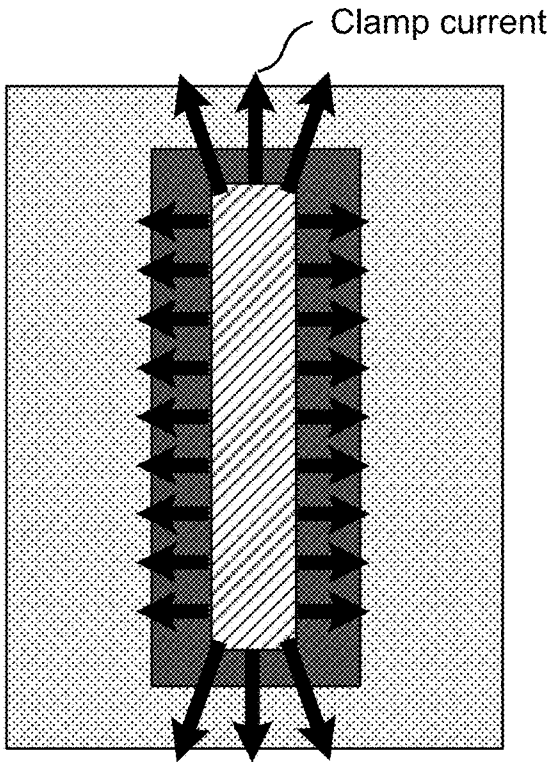
FIG. 6D illustrates a plan view of one fin showing the current flow in the absence of neutralized fin tips according to an embodiment of the present invention.

FIG. 6D illustrates a plan view of one fin showing the current flow in the absence of neutralized fin tips according to an embodiment of the present invention. Current flows laterally (in plan view) from the source contact to the gate contact along the side of the fin, but flows at various angles from the fin tips. The fin tip regions may also have parasitic conduction paths.

Figure 6E:
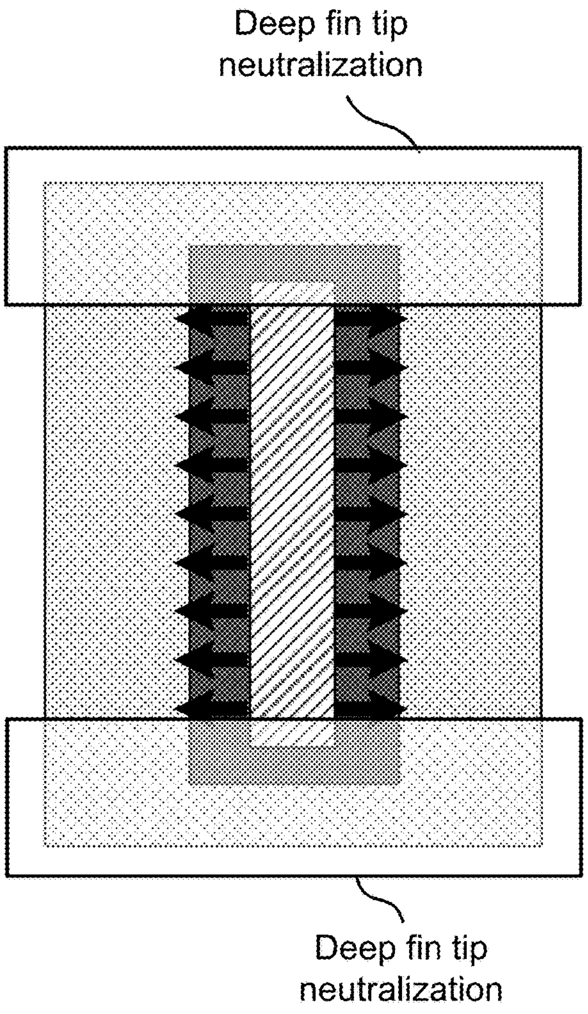
FIG. 6E illustrates a plan view of one fin showing the current flow in the presence of neutralized fin tips according to an embodiment of the present invention.

FIG. 6E illustrates a plan view of one fin showing the current flow in the presence of neutralized fin tips according to an embodiment of the present invention. Current flows laterally (in plan view) from the source contact to the gate contact along the side of the fin, and no current flows from the fin tips, resulting in a more ideal clamp current-voltage behavior.

Thus, as discussed in relation to FIGS. 5A and 5B, the conduction turns on sharply at a particular reverse bias voltage, in this case $V_{clamp}$. This behavior opens up the possibility of making voltage surge protection devices useful in a variety of applications. Because, as illustrated in FIG. 6A, the device uses conduction through a thin surface neutralized layer, this conduction mechanism could be implemented in the context of lateral GaN devices/circuits, for example, high electron mobility transistors (HEMTs) to provide on-chip ESD/surge protection, thereby boosting the protection levels provided for such circuits. As illustrated in FIG. 6B, an abrupt current turn on at reverse bias (similar to Zener diode behavior) can be achieved by embodiments of the present invention with an adjustable turn-on voltage determined by the thickness of source contact isolation region (i.e., the gate surface neutralized region 634 in FIG. 6A). Moreover, embodiments of the present invention enable flexible integration of devices with different turn-on voltages. Thus, using embodiments of the present invention, the voltage at the source node can be clamped at $V_{clamp}$ with respect to the gate node, providing ESD protection since current can be shunted from the source node to the gate node (e.g., at ground). For other semiconductor devices on the die, the voltage at the source node can be utilized during normal device operation, for example, during FinFET operation. This protection of devices that would otherwise fail at high voltages can be implemented using elements that are already present in the FinFET fabrication process and in FinFET devices.

Figure 8A:
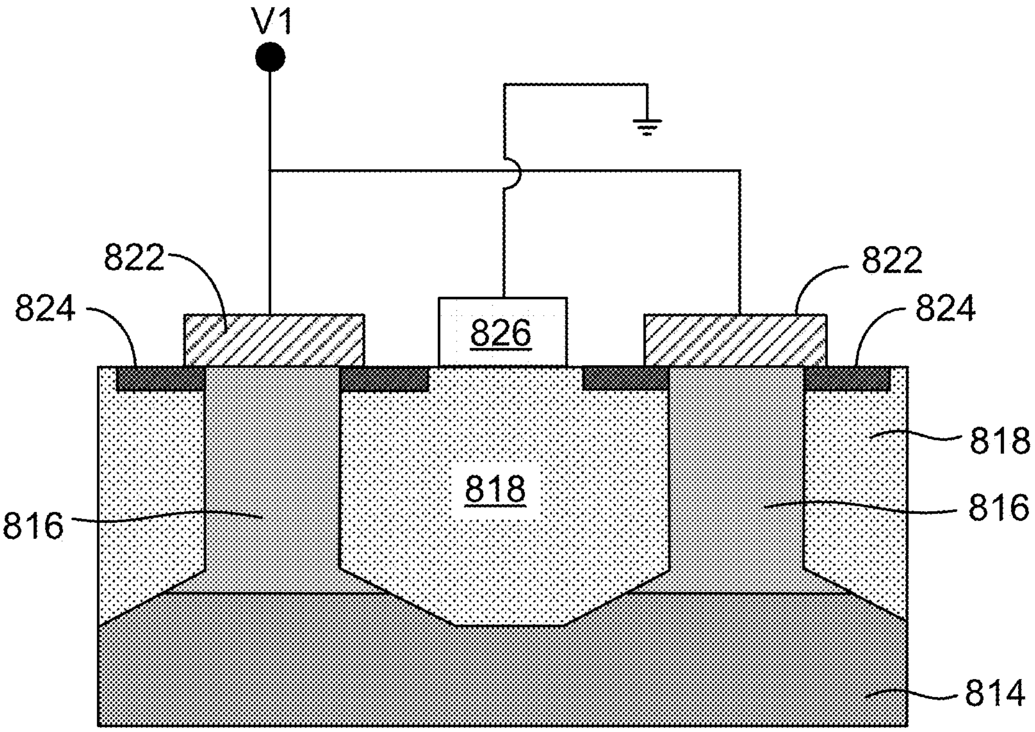
FIG. 8A is a simplified cross-sectional schematic diagram of a set of fins and corresponding circuit wiring according to an embodiment of the present invention.
Figure 9A:
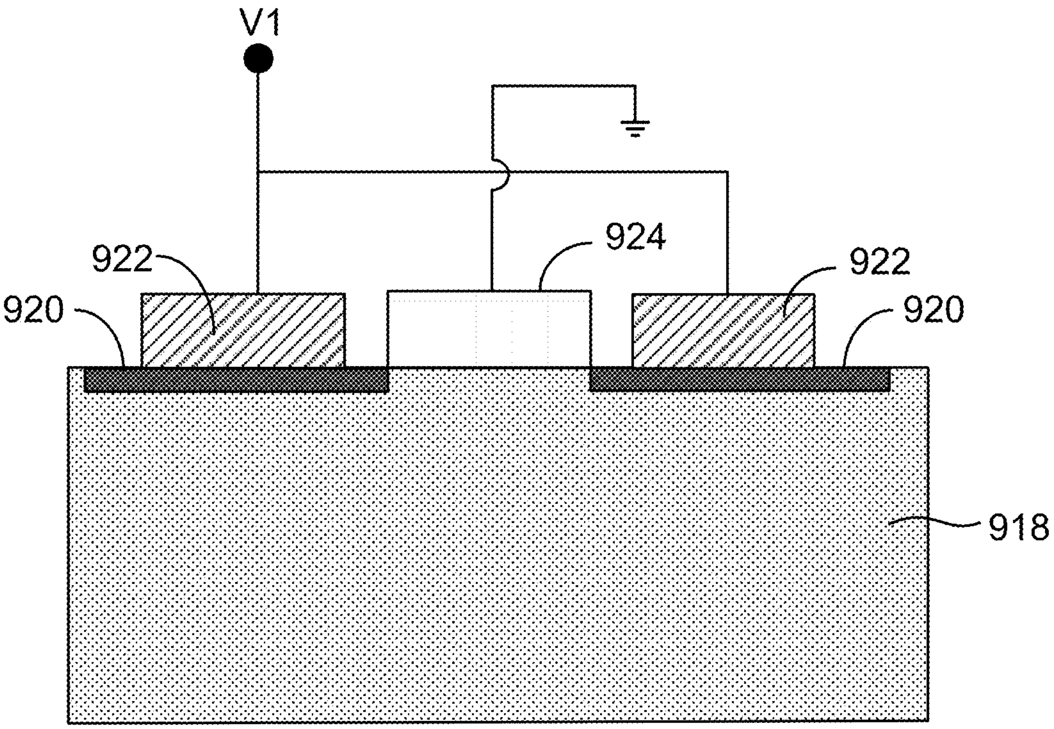
FIG. 9A is a simplified cross-sectional schematic diagram of a clamp comprising a set of source-gate electrode structures and corresponding circuit wiring according to an embodiment of the present invention.

In the embodiment illustrated in FIG. 6A, the voltage clamp architecture was based on a FinFET structure with a drain 610 that can be biased. In other embodiments, the drain potential can be left floating. In addition to this embodiment, other embodiments, for example, as illustrated in FIG. 8A, can be implemented without a drain and one or more epitaxial layers, thereby reducing processing complexity and device cost. Moreover, yet other embodiments, for example, as illustrated in FIG. 9A, can be implemented without fins, one or more epitaxial layers and a drain, thereby reducing processing complexity and device cost.

Figure 7:
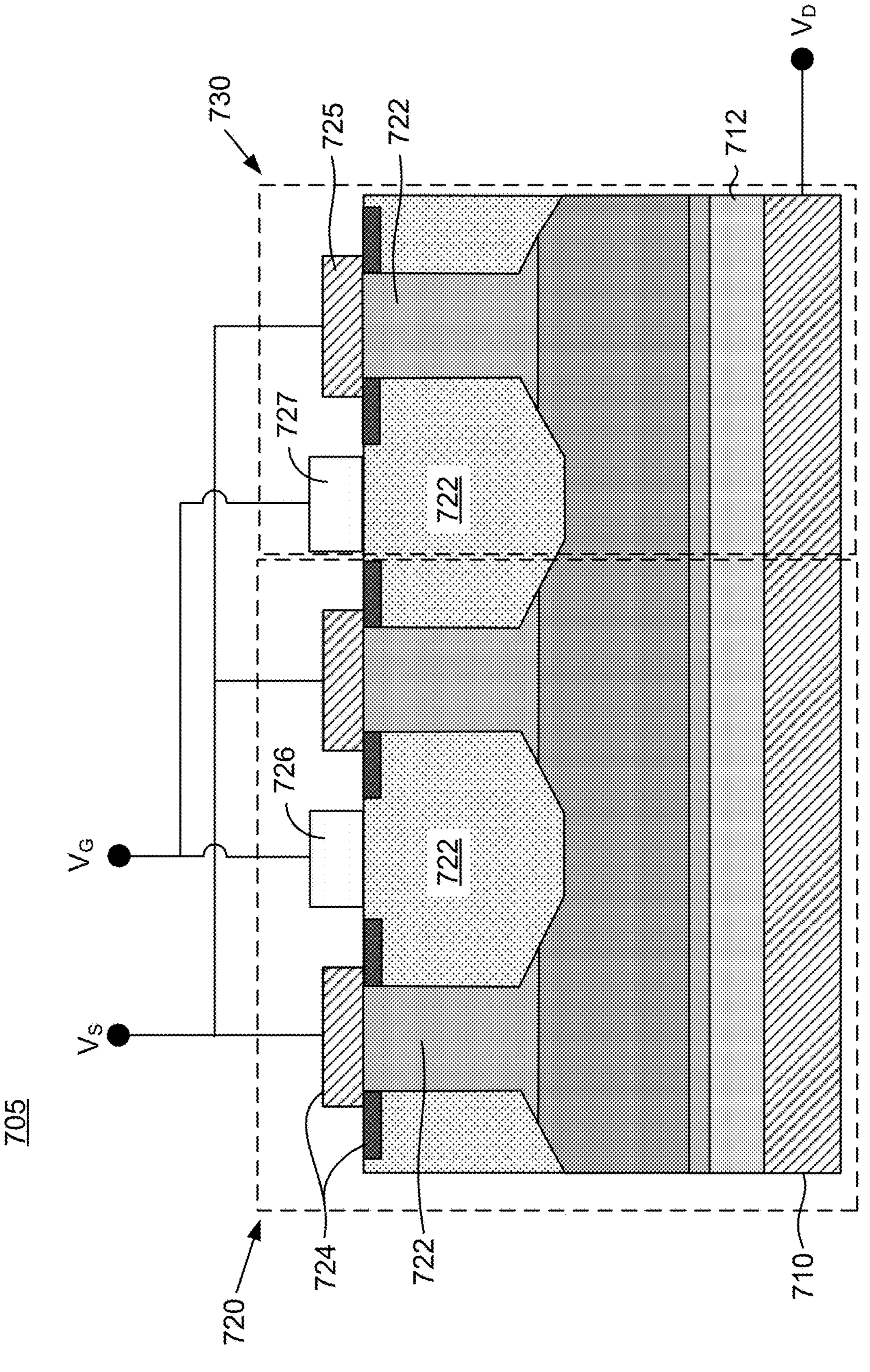
FIG. 7 is a simplified cross-sectional diagram illustrating a FinFET array and a voltage clamp implemented on a semiconductor die according to an embodiment of the present invention.

FIG. 7 is a simplified cross-sectional diagram illustrating a FinFET array and a voltage clamp implemented on a semiconductor die according to an embodiment of the present invention. As illustrated in FIG. 7, FinFET array 720 includes a plurality of FinFETs operated in conjunction with voltage Vs applied to source 724, the voltage VG applied to the gate 726, and the voltage Vp applied to the drain 710. Fins 722 supported by substrate 712 conduct current during FinFET operation from source node (Vs) to drain node (VD) in response to application of the gate bias at gate node (VG).

In addition to FinFET array 720, the semiconductor die 705 also includes voltage clamp 730 including a second source contact 725 that can act as an anode and a second gate contact 727 that can act as a cathode. Utilizing a similar fin structure to FinFET array 720, voltage clamp 730 can be modified such that its clamp voltage level is less than or equal to that of the active FinFET array 720. The thickness of the neutralized region around the source of the voltage clamp 730 can be reduced compared to the equivalent region in the active FinFET array 720. In this way, the voltage clamp 730 will trigger into a low impedance state before the active array triggers. Thus, the voltage clamp 730 will protect the active array during a positive voltage spike on the source with respect to the gate.

Thus, embodiments of the present invention can utilize a small portion of the semiconductor die for use as a voltage clamp in order to protect other elements present on the semiconductor die. The voltage clamp can be optimized to trigger before these other elements on the semiconductor die experience damaging voltages across them and large currents through them. In the embodiment illustrated in FIG. 7, FinFET array 720 is thus protected by voltage clamp 730. In other embodiments, other circuits implemented on the semiconductor die can be protected using voltage clamp 730.

Figure 8B:
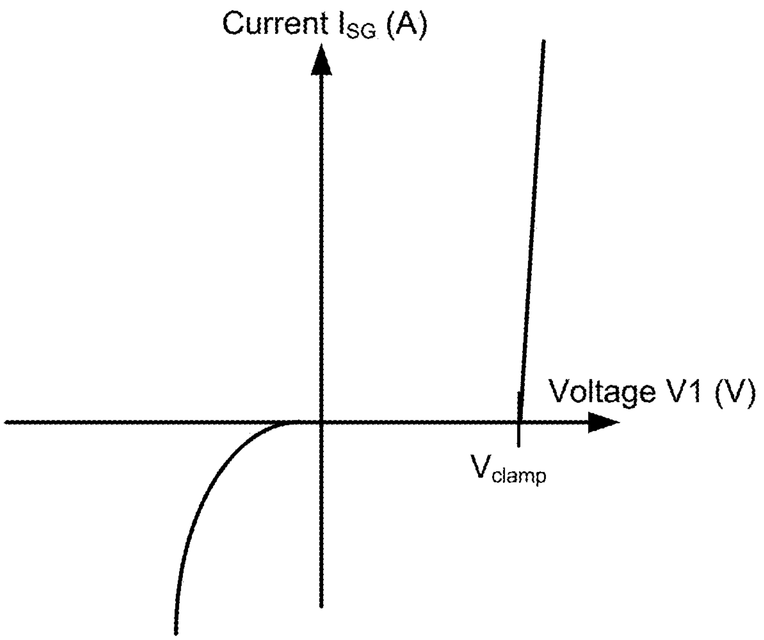
FIG. 8B is a plot illustrating current-voltage characteristics for the set of fins illustrated in FIG. 8A.

FIG. 8A is a simplified cross-sectional schematic diagram of a set of fins and corresponding circuit wiring according to an embodiment of the present invention. FIG. 8B is a plot illustrating current-voltage characteristics for the set of fins illustrated in FIG. 8A. The cross-sectional schematic diagram illustrated in FIG. 8A corresponds to cross-section A-A' in FIG. 1 and cross-section A-A' in FIG. 2A. As illustrated in FIG. 8A, lateral clamp structures can be implemented to protect circuits operating between ground and a positive potential using a simplified semiconductor structure, in particular no epitaxial drift layer or drain. Thus, the embodiment illustrated in FIG. 8A can utilize a portion of the FinFET architecture while not using all elements of the FinFET architecture. Alternatively, a semiconductor die specifically designed for fabrication of voltage clamps could be utilized during fabrication of the voltage clamp illustrated in FIG. 8A. One of ordinary skill in the art would recognize many variations, modifications, and alternatives.

Referring to FIG. 8A, fins 816 are coupled to substrate 814. Gate region 818, e.g., a regrown gate, is also illustrated. Source contact 822 is in electrical contact with each of the fins 816 and gate contact 826 is in electrical contact with the gate region 818. The neutralized region 824 allows a voltage between the source contact 822 and the gate region 818 to result in a large current between the source contact 822 and the gate contact 826 when this voltage exceeds the clamp voltage $V_{clamp}$.

In FIG. 8B, the current flowing from the source node to the gate node is illustrated as a function of the voltage applied to the source node in comparison to the voltage applied to the gate node. Since the source node voltage is positive and the gate is grounded in this example, positive voltage will result in reverse bias operation while negative voltage will result in forward bias operation. Thus, in FIG. 8B, current flow between the source contact 822 and the gate contact 826 is illustrated, both in forward bias (i.e., negative voltages) and reverse bias (positive voltages).

In forward bias, as the source-to-gate voltage decreases below 0 V, current flow occurs as illustrated in FIG. 8B. This current flow can also be used as a clamping mechanism for negative source voltages with respect to the gate voltage. As discussed in relation to FIGS. 5A and 5B, in reverse bias, as the source-to-gate voltage increases above 0 V, substantially no current flows until the clamp voltage ($V_{clamp}$) is reached. For voltages above $V_{clamp}$, current flow increases rapidly, for example, by an order of magnitude for a voltage increase of less than 1 V, resulting in an I-V behavior characterized by an inverse slope between 500 and 1000 millivolts per decade increase in current.

Figure 9B:
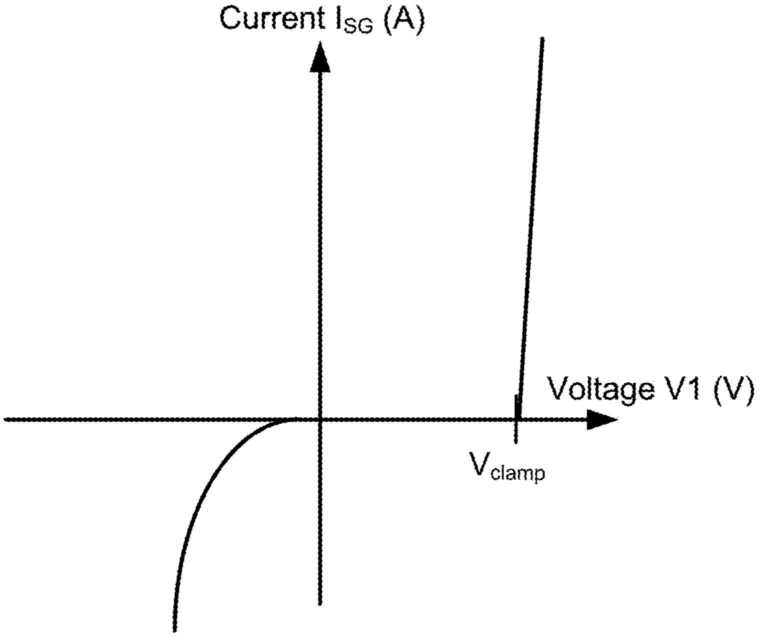
FIG. 9B is a plot illustrating current-voltage characteristics for the set of source-gate structures illustrated in FIG. 9A.

FIG. 9A is a simplified cross-sectional schematic diagram of a clamp comprising a set of source-gate electrode structures and corresponding circuit wiring according to an embodiment of the present invention. FIG. 9B is a plot illustrating current-voltage characteristics for the set of source-gate structures illustrated in FIG. 9A. The cross-sectional schematic diagram illustrated in FIG. 8A corresponds to cross-section A-A' in FIG. 1 and cross-section A-A' in FIG. 2A, however in an embodiment in which no fins are present. As illustrated in FIG. 9A, lateral clamp structures can be implemented to protect circuits operating between ground and a positive potential using a simplified semiconductor structure, in particular no epitaxial drift layer or drain as well as no fin structures. Thus, the embodiment illustrated in FIG. 9A can utilize a portion of the FinFET architecture while not using all elements of the FinFET architecture. Alternatively, a semiconductor die specifically designed for fabrication of voltage clamps could be utilized during fabrication of the voltage clamp illustrated in FIG. 9A. One of ordinary skill in the art would recognize many variations, modifications, and alternatives.

Referring to FIG. 9A, substrate 918 is illustrated. In this embodiment, no fins are fabricated and no gate is fabricated. Rather, a substrate 918 that is a p-type semiconductor substrate is utilized. Neutralized region 920 is formed in substrate 918, source contact 922 is fabricated in electrical contact with neutralized region 920, and gate contact 924 is in electrical contact with the substrate 918. In some embodiments, substrate 918 may be replaced by a p-type epitaxial layer grown on an n-type substrate, a p-type epitaxial layer grown or regrown on an n-type epitaxial layer on an n-type substrate, or an n-type epitaxial layer grown on an n-type substrate. In some embodiments, the epitaxial layer is grown on a silicon, silicon carbide, or sapphire substrate. In some embodiments, source contact 922 is fabricated using one or more of Ti, Al, Mo or TiN. In some embodiments, gate contact 924 is fabricated using one or more of Ti, Ni, Pd, Pt, Au, or Mo. In some embodiments, neutralized region 920 is formed using ion implantation of one or more of O, N, Ar, or He. In some embodiments, source contact 922 and gate contact 924 are formed from the same metal(s).

In FIG. 9B, the current flowing from the source node to the gate node is illustrated as a function of the voltage applied to the source node in comparison to the voltage applied to the gate node. Since the source node voltage is positive and the gate is grounded in this example, positive voltage will result in reverse bias operation while negative voltage will result in forward bias operation. Thus, in FIG. 9B, current flow between the source contact 922 and the gate contact 924 is illustrated, both in forward bias (i.e., negative voltages) and reverse bias (positive voltages).

In forward bias, as the voltage decreases below 0 V, current flow occurs as illustrated in FIG. 9B. This current flow can also be used as a clamping mechanism for negative source voltages with respect to the gate voltage. As discussed in relation to FIGS. 5A and 5B, in reverse bias, as the voltage increases above 0 V, substantially no current flows until the clamp voltage ($V_{clamp}$) is reached. For voltages above $V_{clamp}$, current flow increases rapidly, for example, by an order of magnitude for a voltage increase of less than 1 V, resulting in an I-V behavior characterized by an inverse slope between 500 and 1000 millivolts per decade increase in current. The clamp voltage $V_{clamp}$ can be tuned by changing the thickness of the neutralized region 920 (e.g., by changing the implant depth of the neutralizing implant(s)). A thicker neutralized region 920 will result in a higher clamp voltage $V_{clamp}$. For a neutralized region 920 with a thickness of approximately 150 nm, the clamp voltage $V_{clamp}$ is approximately 58 V.

Referring to FIG. 7, the portion of semiconductor die 705 corresponding to voltage clamp 730 can be masked during fabrication of the fin structures, gate regrowth, and the like. Accordingly, using a partially unprocessed or unprocessed portion of semiconductor die 705, the set of source-gate electrode structures illustrated in FIG. 9A could be fabricated on substrate 712 to implement an alternative voltage clamp design in conjunction with FinFET array 720. One of ordinary skill in the art would recognize many variations, modifications, and alternatives.

Figure 10A:
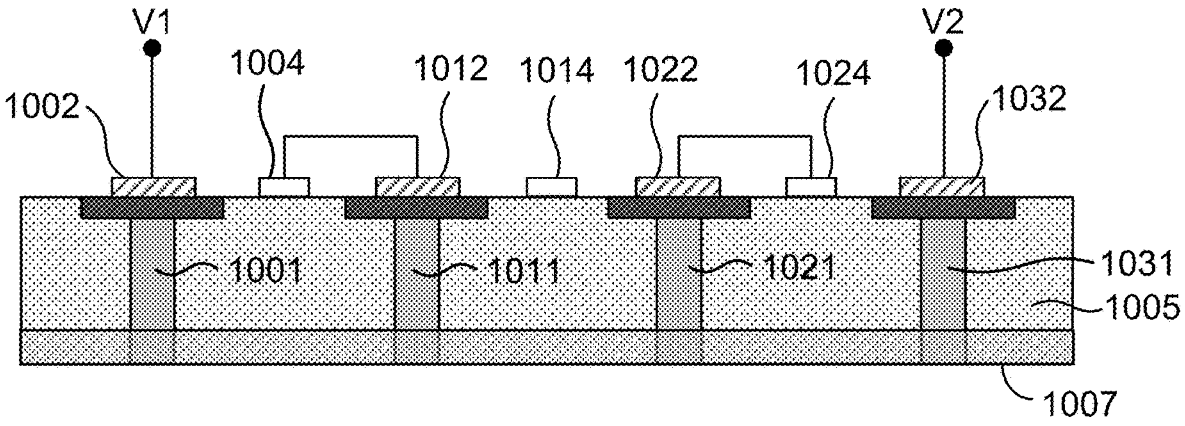
FIG. 10A is a simplified cross-sectional schematic diagram illustrating a multi-stage voltage clamp device according to an embodiment of the present invention.
Figure 10B:
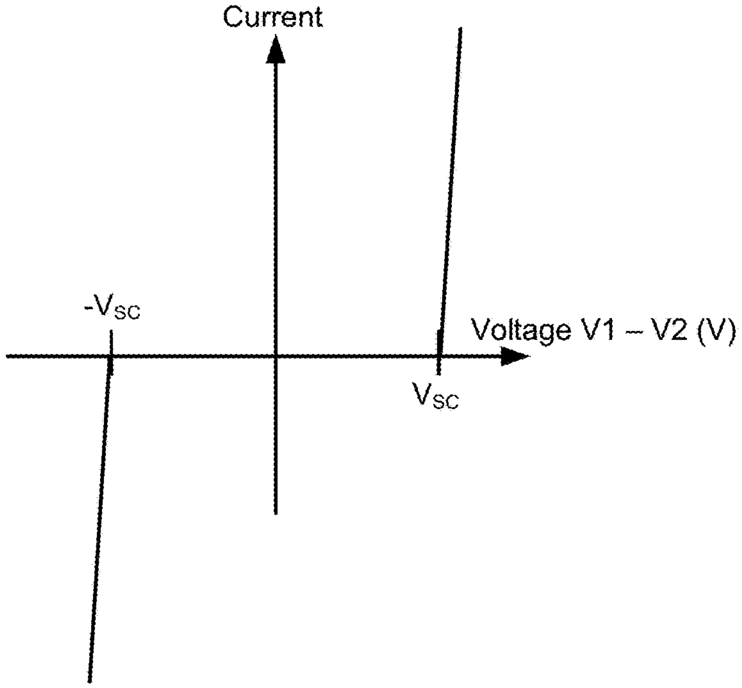
FIG. 10B is a plot illustrating current-voltage characteristics for the multi-stage voltage clamp device illustrated in FIG. 10A.

FIG. 10A is a simplified cross-sectional schematic diagram illustrating a multi-stage voltage clamp device according to an embodiment of the present invention. FIG. 10B is a plot illustrating current-voltage characteristics for the multi-stage voltage clamp device illustrated in FIG. 10A. The multi-stage voltage clamp device illustrated in FIG. 10A shares common elements with the set of FinFETs illustrated in FIG. 6A and the description provided in relation to FIG. 6A is applicable to FIG. 10A as appropriate. In FIG. 10A, a symmetric clamp is provided as discussed more fully below in relation to FIG. 10B.

Referring to FIG. 10A, voltage source V1 is connected to source contact 1002 formed on fin 1001. Gate contact 1004 is electrically connected to source contact 1012 formed on fin 1011. Source contact 1022 formed on fin 1021 is electrically connected to gate contact 1024. Voltage source V2 is connected to source contact 1032 formed on fin 1031. An electrically insulating structure 1007 is formed in substrate 1005 in order to electrically isolate each of the fins from the other fins. In other words, each source contact is electrically isolated from the other source contacts. Since current flow between the fins through electrically insulating structure 1007 is prevented, the current flow will occur from source contact 1002 to source contact 1032 as a result of the reverse bias diodes formed by adjacent sources and gate and forward bias diodes formed by gates and sources. In an embodiment, electrically insulating structure 1007 can be implemented as a retrograde isolation implant that can use helium or nitrogen or another species suitable to neutralize the GaN. In addition, lateral isolation is provided between the different gate nodes. This is implemented in the embodiment shown in FIG. 10A by preventing connection using the fin structure and an array neutralizing implant process that neutralizes the p-GaN gate, e.g., to its full depth, at the fin ends. In an embodiment, electrically insulating structure 1007 can be an insulating substrate (e.g., sapphire, semi-insulating SiC, or semi-insulating GaN) on which substrate 1005 is epitaxially grown.

Referring once again to FIG. 10A, a predetermined portion of the semiconductor die could be processed to form electrically insulating structure 1007 in the predetermined portion while providing electrical conductivity for the fins and drain of a FinFET array in other portions of the semiconductor die. Alternatively, the entire semiconductor die could integrate electrically insulating structure 1007 in order to fabricate one or more symmetric voltage clamps as standalone devices.

Referring to FIG. 10A, the clamp voltage $V_{SC}$ can be determined by considering the number of reverse bias diodes (e.g., source contact 1002 to gate contact 1004) and the number of forward bias diodes (e.g., gate contact 1014 to source contact 1022) in series. Thus, during operation, the clamp voltage $V_{SC}$ for the symmetric voltage clamp will be:

$$V_{SC} = \pm N(V_{clamp} + V_F),$$

where N is the number of reverse bias diodes and forward bias diodes in series, $V_{clamp}$ is the clamp voltage for the reverse bias diodes, and Vp is the forward diode voltage drop for the forward bias diodes.

During operation, application of voltage V1 to source contact 1002 and voltage V2 to source contact 1032, with V1>V2, will result in source contact 1002 and gate contact 1004, as well as source contact 1012 and gate contact 1014, forming a reverse bias diode. Concurrently, gate contact 1014 and source contact 1022, as well as gate contact 1024 and source contact 1032, will form a forward bias diode. As a result, each source/gate pair and each gate/source pair will support a reverse bias clamp voltage ($V_{clamp}$) and a forward diode bias drop ($V_F$), resulting in $V_{SC}=2\ (V_{clamp}+V_F)$.

Because the device is symmetric, application of voltage $V_2>V_1$ will result in symmetric performance, with two reverse bias diodes formed by source contact 1032 and gate contact 1024 and source contact 1022 and gate contact 1014, respectively, and two forward bias diodes formed by gate contact 1014 and source contact 1012 and gate contact 1004 and source contact 1002, respectively. As a result, each source/gate pair and each gate/source pair will support a reverse bias clamp voltage ($V_{clamp}$) and a forward diode bias drop ($V_F$), resulting in $V_{SC}=-2\ (V_{clamp}+V_F)$ for $V_2>V_1$. Accordingly, for $V_{clamp}=58$ V and $V_F=3$ V, $V_{SC}=122$ V. FIG. 10B illustrates the symmetric behavior discussed above.

Figure 11:
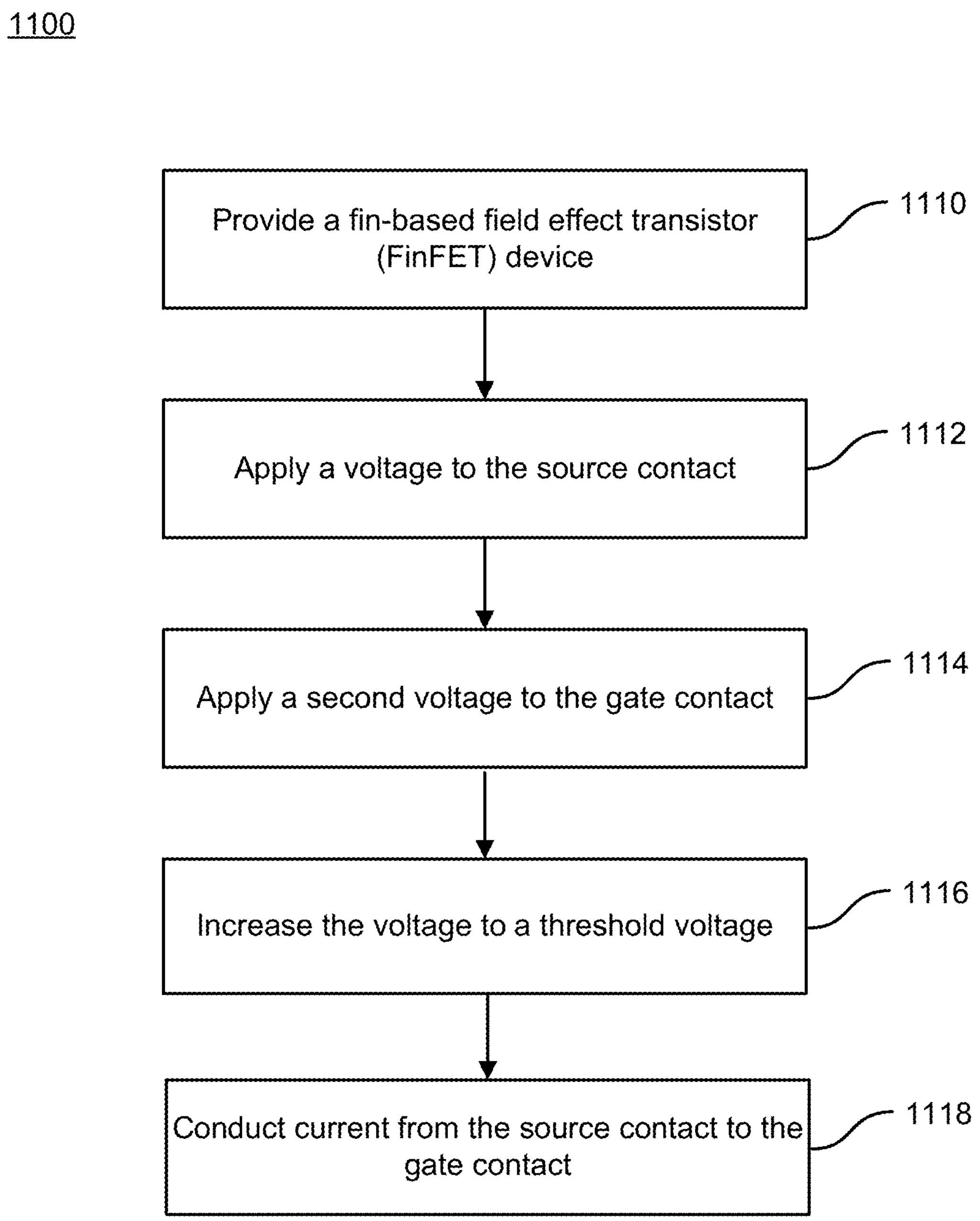
FIG. 11 is a simplified flowchart illustrating a method of clamping a voltage according to an embodiment of the present invention.

FIG. 11 is a simplified flowchart illustrating a method of clamping a voltage according to an embodiment of the present invention. The method 1100 includes providing a fin-based field effect transistor (FinFET) device (1110). The FinFET device includes an array of FinFETs. Each FinFET includes a source contact electrically coupled to a fin and a gate contact. The method also includes applying the voltage to the source contact (1112) and applying a second voltage to the gate contact (1114). The voltage is greater than the second voltage. The method also includes increasing the voltage to a threshold voltage (1116) and conducting current from the source contact to the gate contact in response to the voltage reaching the threshold voltage (1118).

In some embodiments, each FinFET further includes a central region characterized by a first electrical conductivity and fin tips characterized by a second electrical conductivity less than the first electrical conductivity. In various embodiments, the fin tips include a neutralized region including traps or a neutralized region including an ion implanted region. Each FinFET can additionally include a first central gate region disposed on a first lateral side of the fin and a second central gate region disposed on a second lateral side of the fin. The first central gate region and the second central gate region are characterized by a third electrical conductivity. An area of each of the fin tips can be between 1% and 10% of an area of fin. As an example, the fin tips can have a tip length and a ratio of a fin length to the tip length is greater than 10:1, greater than 25:1, or greater than 100:1.

In an embodiment, conducting current from the source contact to the gate contact can include conducting the current through the neutralized region. As an example, conducting the current through the neutralized region can include field induced enhancement of variable range hopping between the traps in the neutralized region. In an embodiment, the source contact is defined by a lateral source dimension and the neutralized region is defined by a lateral neutralized dimension ($W_{neutralized}$) that is greater than the depth of the neutralized region and greater than the lateral source dimension ($W_{source}$). The second voltage can be ground. Utilizing embodiments of the present invention, the current can increase by a factor of 10 or greater over a voltage range less than 3% of the threshold voltage, less than 1% of the threshold voltage, or the like.

In an embodiment, the FinFET device includes a gate region disposed between adjacent fins in the array of FinFETs and the gate contact is electrically coupled to the gate region. The source contact can be a cathode and the gate contact can be a cathode while conducting current from the source contact to the gate contact. The fin can include a III-N semiconductor, for example, GaN.

It should be understood that examples discussed herein are not intended to be limiting. For example, in addition to bulk GaN substrates mentioned above, the substrate can be GaN on SiC or GaN on Si in other embodiments. In addition to GaN, other III-N materials (e.g., AlN, AlGaN and the like) may be used to form the clamp structure. Other wide-bandgap materials (i.e., with bandgap energies greater than 3 eV, e.g., SiC, $Ga_2O_3$, or diamond) may be used as the substrate and/or epitaxial materials for forming the voltage clamp. As another example, instead of vertically regrown JFETs, the methods provided according to the present invention can also be applied to semiconductor devices such as lateral regrown transistors, implanted JFETs, diffused JFETs, and the like. As yet another example, instead of n-GaN as the fins and p-GaN as the regrown gate region, the JFET can be fabricated using p-GaN as the fins and n-GaN as the regrown gate region. Although some embodiments described herein are discussed in the context of GaN FinFETs, embodiments of the present invention are not limited to this particular semiconductor material and FinFETs fabricated in other materials can be utilized in conjunction with the methods and systems described herein, including materials that are not III-N semiconductor materials, such as silicon carbide, gallium oxide, or the like.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known," and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to," or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A voltage clamp device, comprising:
a FinFET, comprising:
a central region characterized by a first electrical conductivity;
a fin tip region characterized by a second electrical conductivity less than the first electrical conductivity;
a source contact configured to receive a voltage; and
a gate contact, wherein the FinFET is configured to conduct a current from the source contact to the gate contact in response to the voltage reaching a threshold voltage.

2. The voltage clamp device of claim 1, comprising a FinFET array, wherein the FinFET array comprises a plurality of the FinFETs.

3. The voltage clamp device of claim 1, wherein the central region comprises a first neutralized region.

4. The voltage clamp device of claim 3, wherein the first neutralized region is defined by a lateral neutralized dimension greater than a depth of the first neutralized region.

5. The voltage clamp device of claim 1, wherein the fin tip region comprises a second neutralized region.

6. The voltage clamp device of claim 5, wherein the FinFET is characterized by a fin height and the second neutralized region is defined by a depth greater than or equal to 70% of the fin height.

7. The voltage clamp device of claim 4, wherein the gate contact is coupled with ground.

8. An integrated electronic device, comprising:
a first FinFET, comprising:
a first source contact;
a first gate region; and
a first neutralized region in contact with the first source contact and the first gate region, wherein the first neutralized region is defined by a first thickness; and
a voltage clamp, comprising:
a second FinFET, comprising:
a second source contact;
a second gate region; and
a second neutralized region in contact with the second source contact and the second gate region, wherein the second neutralized region is defined by a second thickness and wherein the first thickness is greater than the second thickness.

9. The integrated electronic device of claim 8, wherein:
the first source contact and the second source contact are configured to receive a voltage; and
the second neutralized region is configured to conduct a current from the second source contact to the second gate region in response to the voltage reaching a clamp voltage.

10. The integrated electronic device of claim 9, wherein:
the first neutralized region is configured to insulate the first source contact from the first gate region in response to the voltage reaching the clamp voltage.

11. The integrated electronic device of claim 10, wherein:
the second FinFET comprises:
a central region comprising the second neutralized region; and
a fin tip region comprising a third neutralized region defined by a first depth, wherein the second FinFET is characterized by a fin height and the first depth is greater than or equal to 70% of the fin height.

12. The integrated electronic device of claim 11, wherein:
the central region is characterized by a first electrical conductivity; and
the fin tip region is characterized by a second electrical conductivity less than the first electrical conductivity.

13. The integrated electronic device of claim 11, wherein:
the third neutralized region is configured to insulate the second source contact from the second gate region at the clamp voltage.

14. A voltage clamp device, comprising:
a FinFET, comprising:
a first gate region;
a first source contact configured to receive a voltage;
a central region comprising a first neutralized region in contact with the first source contact and the first gate region; and
a fin tip region comprising a second neutralized region in contact with the first source contact and the first gate region, wherein the FinFET is configured to conduct a current from the first source contact to the first gate region through the first neutralized region in response to the voltage reaching a threshold voltage.

15. The voltage clamp device of claim 14, wherein the FinFET is configured to prevent the current from conducting through the second neutralized region in response to the voltage reaching the threshold voltage.

16. The voltage clamp device of claim 14, wherein:
the central region is characterized by a first electrical conductivity; and
the fin tip region is characterized by a second electrical conductivity less than the first electrical conductivity.

17. The voltage clamp device of claim 14, wherein:
the first neutralized region is defined by a first thickness;
the second neutralized region is defined by a second thickness; and
the second thickness is greater than the first thickness.

18. The voltage clamp device of claim 17, further comprising:
a second FinFET comprising:
a second source contact;
a second gate region; and
a third neutralized region in contact with the second source contact and the second gate region, wherein:
the third neutralized region is defined by a third thickness; and
the third thickness is greater than or equal to the first thickness.

19. The voltage clamp device of claim 14, wherein the voltage comprises a voltage difference between a first voltage level of the first source contact and a second voltage level of the first gate region.

20. The voltage clamp device of claim 19, wherein the second voltage level is ground.

* * * * *